(12) United States Patent
Hermesh et al.

(10) Patent No.: US 10,074,423 B1
(45) Date of Patent: Sep. 11, 2018

(54) IMPEDANCE TUNING BETWEEN PACKAGING AND DIES

(71) Applicant: SanDisk Technologies LLC, Plano, TX (US)

(72) Inventors: Nimrod Hermesh, Mazkeret Batia (IL); Eliran Kanza, Holon (IL)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/453,418

(22) Filed: Mar. 8, 2017

(51) Int. Cl.
*G11C 8/06* (2006.01)
*G11C 13/00* (2006.01)
*H01L 25/065* (2006.01)
*H03H 11/30* (2006.01)
*G11C 7/00* (2006.01)

(52) U.S. Cl.
CPC ........ *G11C 13/0069* (2013.01); *G11C 13/004* (2013.01); *H01L 25/0657* (2013.01); *H03H 11/30* (2013.01); *G11C 7/00* (2013.01); *G11C 8/06* (2013.01)

(58) Field of Classification Search
CPC .................................. G11C 8/06; G11C 7/00
USPC .......................... 365/49, 190, 230, 900, 149
See application file for complete search history.

(56) References Cited

U.S. PATENT DOCUMENTS 9,268,719 B2 * 2/2016 Shaeffer .................. G06F 13/16
2006/0138650 A1 6/2006 Hidalgo et al.

FOREIGN PATENT DOCUMENTS

WO  WO 2004/100263 A2  11/2004

* cited by examiner

*Primary Examiner* — Jason Lappas
(74) *Attorney, Agent, or Firm* — Brinks Gilson & Lione

(57) ABSTRACT

An apparatus may include a controller configured to communicate with a plurality of dies via a signal path. The controller may notify the dies of its desire to communicate with a target die. In response, the dies may set on-die termination resistances of two or more of the dies to a low resistance value, which in turn may set an overall termination resistance of the memory dies to be lower than the low resistance value. The lower overall termination resistance may be closer to a characteristic impedance of a portion of the signal path comprising packaging components of a packaging of the dies compared to the low resistance value, thereby reducing impedance mismatch between the characteristic impedance of the packaging components and the termination resistance.

21 Claims, 8 Drawing Sheets

US 10,074,423 B1

IMPEDANCE TUNING BETWEEN PACKAGING AND DIES

BACKGROUND

A memory system may communicate signals carrying data, command, or clocking information for the storage of data within the memory system. The signals may be communicated along signal paths that each have an overall characteristic impedance. Within a single signal path, different portions or segments may have their own characteristic impedance, which contributes to the overall characteristic impedance of the signal path. In general, it may be desirable for each of these different portions or segments to have the same characteristic impedance or as close to the same characteristic impedance as possible. Conversely, different or substantially different characteristic impedances between two or more of the different portions can lead to undesirable energy reflection, leading to degradation in signal integrity and ultimately performance. Where impedance mismatches do occur, ways to minimize these impedance mismatches may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF EMBODIMENTS

Overview

Figure 1A:
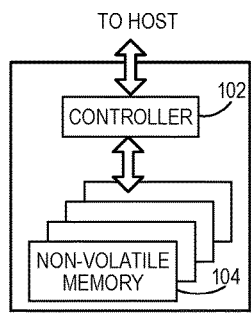
FIG. 1A is a block diagram of an example non-volatile memory system.

By way of introduction, the below embodiments relate to minimizing impedance mismatch between on-die termination resistances of a plurality of dies and a packaging of the plurality of dies. In one embodiment, an apparatus includes a plurality of dies and a controller. The controller is configured to identify a target die of the plurality of dies with which to communicate, and in response to the identification, communicate a signal to the target die via a signal path connecting the controller and the target die. During the communication, a termination resistance circuit of a non-target die is at a low resistance level.

In some embodiments, the non-target die is configured to adjust the termination resistance circuit of the non-target die from a high resistance level to the low resistance level prior to the communication of the signal to the target die.

In some embodiments, the low resistance level is in a range of about 40-60 Ohms.

In some embodiments, the low resistance level is a minimum level to which the termination resistance circuit is configured to be set.

In some embodiments, the high resistance level is greater than one kilohm (1 k$\Omega$).

In some embodiments, the controller, in response to the identification, is further configured to set a termination resistance circuit of the target die to the low resistance level, where the termination resistance circuit of the target die and the termination resistance circuit of the non-target die form a parallel connection.

In some embodiments, the controller, in response to the identification, is further configured to set a plurality of termination resistance circuits of a plurality of non-target dies. The plurality of termination resistance circuits of the plurality of non-target dies and the target resistance of the target die form a parallel connection with each other.

In some embodiments, a number of the plurality of non-target dies is less than a total number of the plurality of dies.

In some embodiments, the plurality of dies are part of a same chip group.

In some embodiments, the plurality of dies are configured as a stack.

In another embodiment, a method of setting termination resistance is performed. The method includes: receiving, with a plurality of dies, instructions to set a first termination resistance circuit of a first die of the plurality of dies and a second termination resistance circuit of a second die of the plurality of dies to a low resistance level. Each of the first termination resistance circuit and the second termination resistance circuit are configured to be set to a high resistance level and the low resistance level. The method further includes, in response to the instructions, setting, with the plurality of dies, each of the first termination resistance circuit and the second termination resistance circuit to the low resistance level; and while the first termination resistance and the second termination resistance are each at the low resistance level, receiving, at a contact pad of one of the plurality of dies, an input signal to be processed by the first die.

In some embodiments, the contact pad is located on the first die or the second die.

In some embodiments, the first termination resistance circuit and the second termination resistance circuit form a parallel connection.

In some embodiments, the method further includes: in response to the instructions, setting a third termination resistance circuit of a third die of the plurality of dies to the low resistance level, where at least one of the second die or the third die is adjacent to the first die.

In some embodiments, setting each of the first termination resistance circuit and the second termination resistance circuit to the low resistance level sets an overall termination resistance of the plurality of dies to a resistance level that is lower than the low resistance level.

In some embodiments, the plurality of dies comprises a plurality of memory dies.

In another embodiment, a memory system includes a plurality of memory dies and a controller. Each of the memory dies includes a respective termination resistance. The controller is configured to: determine to write data to a target memory die of the plurality of memory dies, and issue instructions to the plurality of memory dies to set an overall termination resistance for the plurality of memory dies. The plurality of memory dies is configured to: in response receipt of the instructions, set the overall termination resistance by setting a first set of termination resistance circuits for a first set of memory dies of the plurality of memory dies to a low resistance value and setting a second set of termination resistance circuits for a second set of memory dies of the plurality of memory dies to a high resistance value, and receive the data for programming into the target memory die while the plurality of memory dies are set to have the overall termination resistance.

In some embodiments, the low resistance value is less than one-hundred ohms (100Ω) and the high resistance value is greater than one kilohms (1 kΩ).

In some embodiments, the first set of termination resistance circuits form a parallel connection.

In some embodiments, the controller is configured to send the data to the target memory die via a signal path, and the overall termination resistance is closer to a characteristic impedance of a packaging portion of the signal path than the low resistance value.

In another embodiment, an apparatus includes: a plurality of dies; means for identifying a target die of the plurality of dies with which to communicate a signal; means for setting a termination resistance circuit of a non-target die of the plurality of dies to a low resistance level in response to identifying the target die; and means for communicating the signal with the target die via a signal path while the termination resistance circuit of the non-target die is set to the low resistance level.

Other embodiments are possible, and each of the embodiments can be used alone or together in combination. Accordingly, various embodiments will now be described with reference to the attached drawings.

Embodiments

The following embodiments describe systems, apparatuses, and methods for minimizing impedance mismatch between on-die termination resistances of a plurality of dies and a packaging of the plurality of dies. Before turning to these and other embodiments, the following paragraphs provide a discussion of exemplary non-volatile memory systems and storage modules that can be used with these embodiments. Of course, these are just examples, and other suitable types of systems or apparatuses, includes other types of memory systems and/or storage modules, can be used.

FIG. 1A is a block diagram illustrating a non-volatile memory system 100. The non-volatile memory system 100 may include a controller 102 and non-volatile memory that may be made up of a plurality of non-volatile memory dies 104. As used herein, the term memory die refers to the set of non-volatile memory cells, and associated circuitry for managing the physical operation of those non-volatile memory cells, that are formed on a single semiconductor substrate. In addition, the term die, in general, may refer to circuitry or circuit components on a single semiconductor substrate, but may or may not include non-volatile memory cells to store data. The controller 102 may interface with a host system and transmit command sequences for read, program, and erase operations to the non-volatile memory dies 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory dies 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

Although in the example illustrated in FIG. 1A, the non-volatile memory system 100 may include a single channel between the controller 102 and the non-volatile memory dies 104, the subject matter described herein is not limited to having a single memory channel. For example, in some memory system architectures, 2, 4, 8 or more channels may exist between the controller and the NAND memory dies 104, depending on controller capabilities. In any of the embodiments described herein, more than a single channel may exist between the controller and the memory dies 104, even if a single channel is shown in the drawings.

Figure 1B:
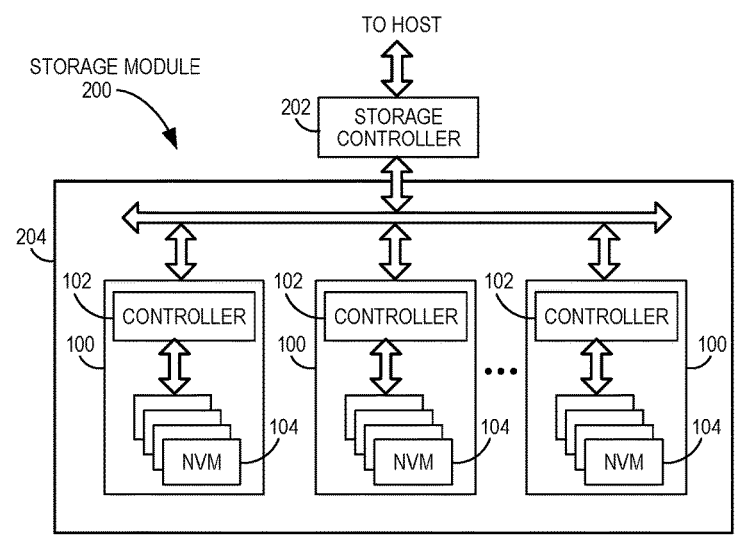
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
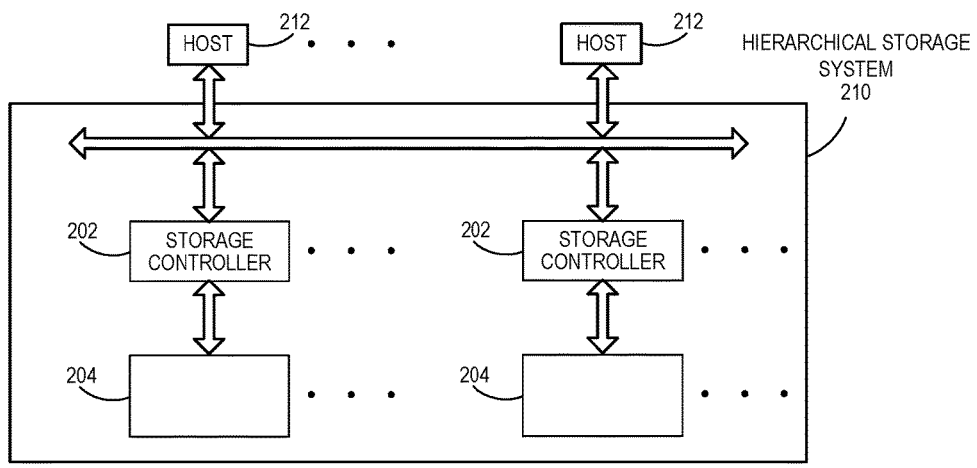
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
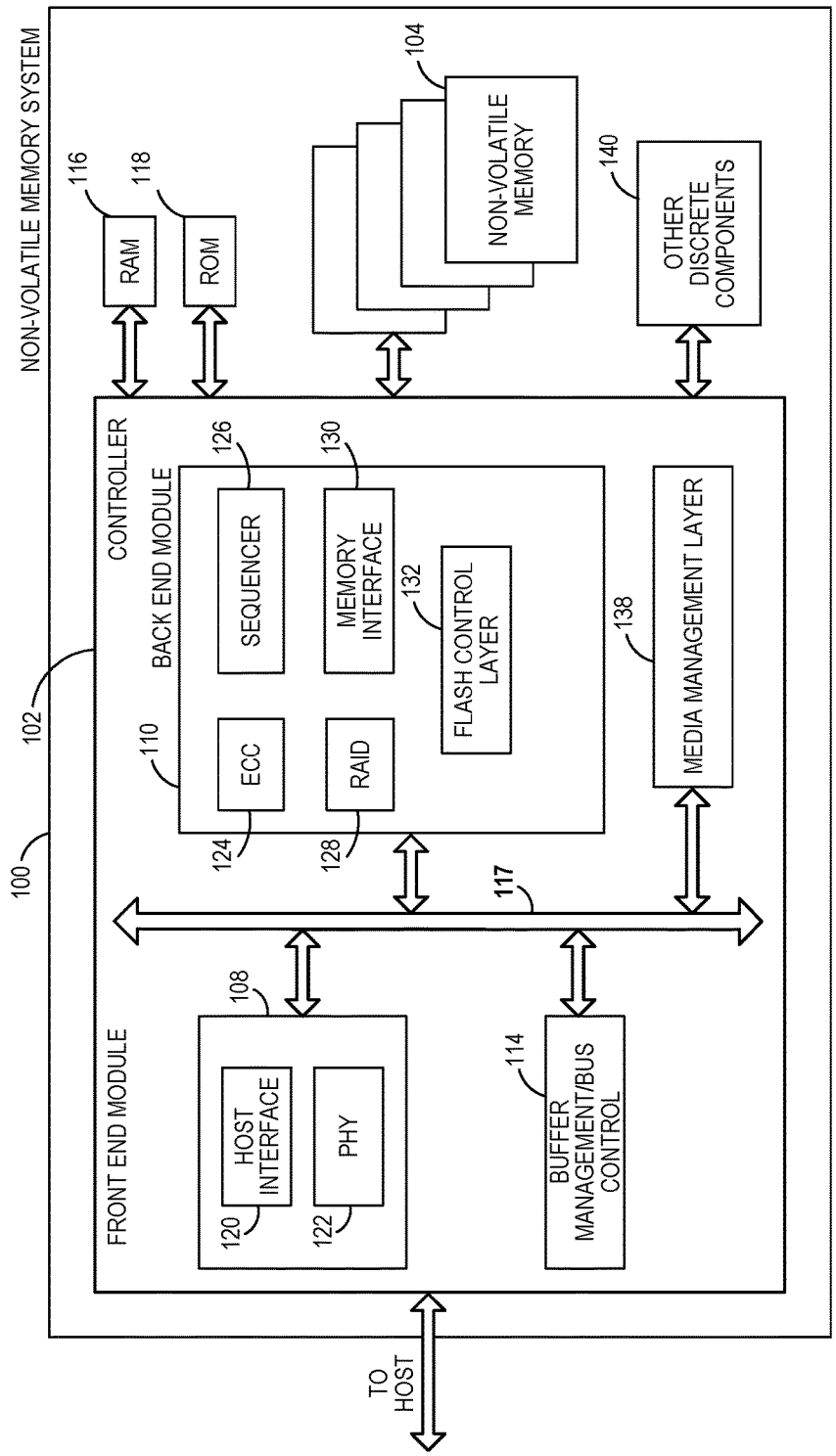
FIG. 2A is a block diagram of example components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory dies 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory dies 104 and receives status information from the non-volatile memory dies 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

Additional modules of the non-volatile memory system 100 illustrated in FIG. 2A may include a media management layer 138, which may perform address management and wear leveling of memory cells of the non-volatile memory dies 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
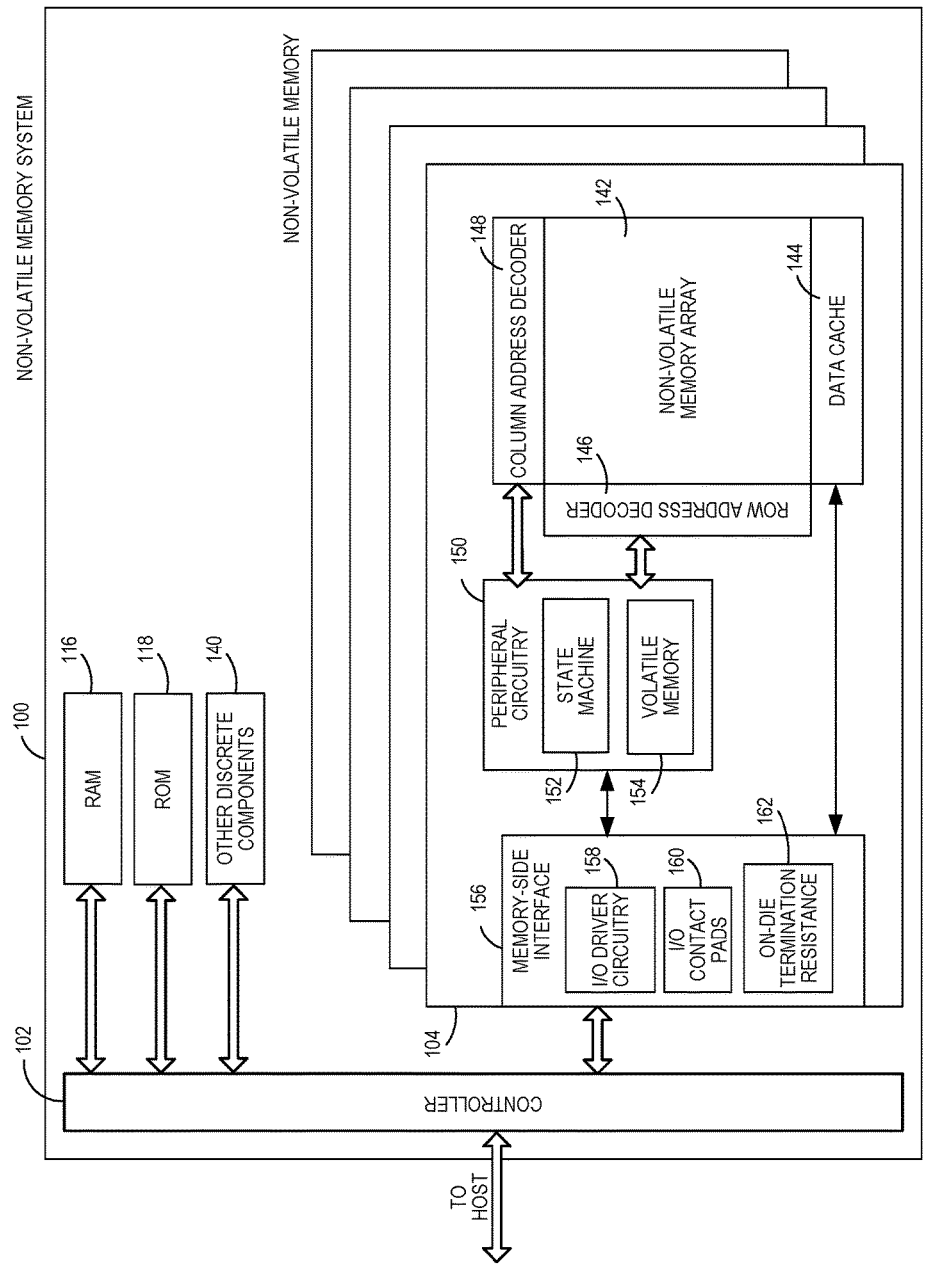
FIG. 2B is a block diagram of example components of a non-volatile memory die of the non-volatile memory system of FIG. 1A.

FIG. 2B is a block diagram illustrating exemplary components of one of the non-volatile memory dies 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple bits (two, three, four, or more bits) of data per cell, or combinations thereof.

Additionally, in the array 142, a flash memory cell may include a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a FGT (or memory cell). A column of FGTs may be referred to as a string. FGTs in a string or column may be electrically connected in series. A row of FGTs may be referred to as a page. Control gates of FGTs in a page or row may be electrically connected together.

The memory array 142 may also include wordlines and bitlines connected to the FGTs. Each page of FGTs is coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
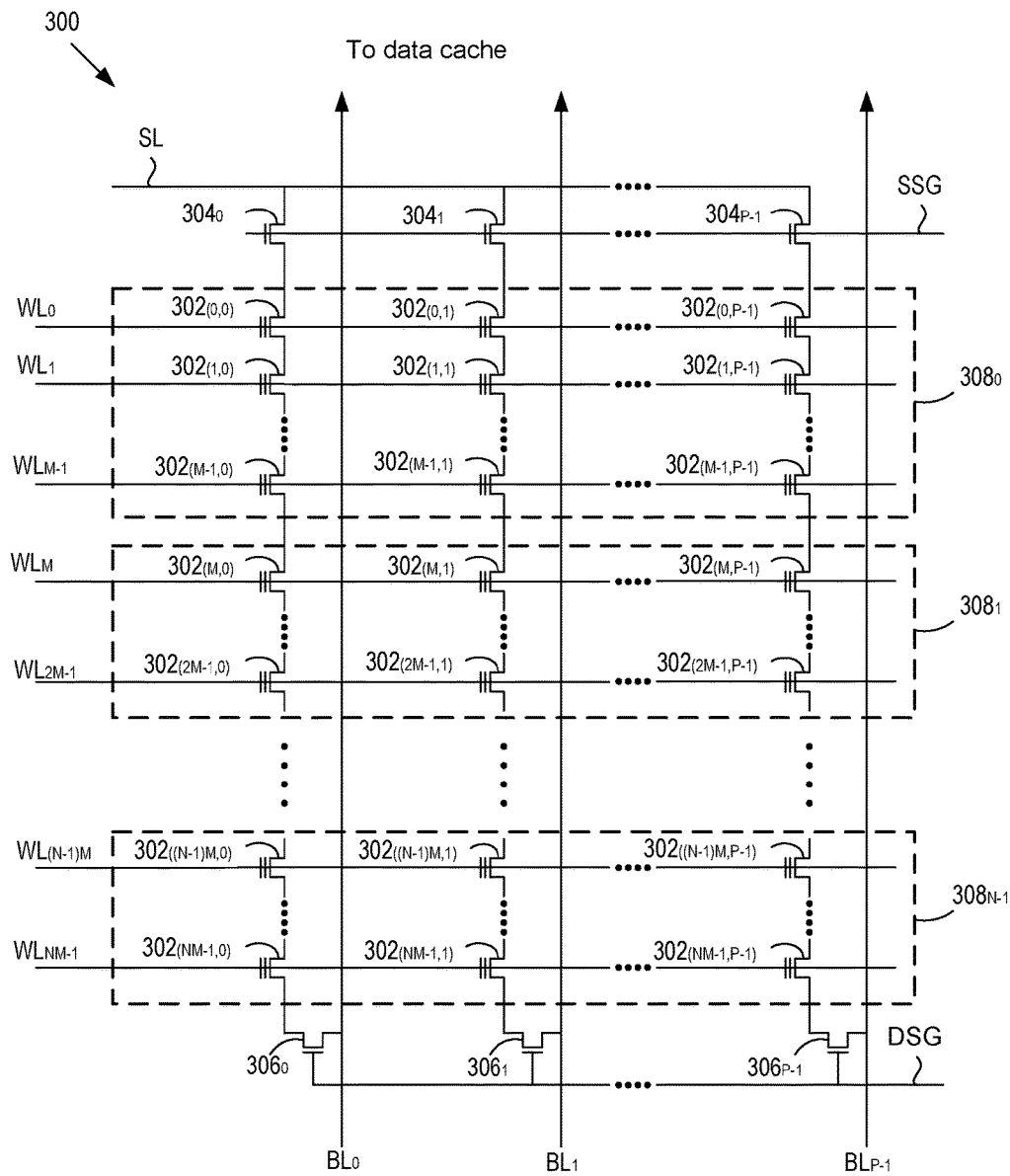
FIG. 3 is a circuit schematic diagram of an example NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled.

Switching of source select transistors $304_0$, $304_1$, ..., $304_{P-1}$ may be controlled using a source select gate bias line SSG that supplies a source select gate bias voltage $V_{SSG}$ to turn on an off the source select transistors $304_0$, $304_1$, ..., $304_{P-1}$. Additionally, switching of drain select transistors $306_0$, $306_1$, ..., $306_{P-1}$ may be controlled using a drain select gate bias line DSG that supplies a drain select gate bias voltage $V_{DSG}$ to turn on and off the drain select transistors $306_0$, $306_1$, ..., $306_{P-1}$.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that provides status information to the controller 102. Other functionality of the state machine 152 is described in further detail below. The peripheral circuitry 150 may also include volatile memory 154. An example configuration of the volatile memory 154 may include latches, although other configurations are possible.

Also, the non-volatile memory die 104 may include a memory-side interface 156 that is configured to interface and communicate with the memory interface 130 of the controller 102. The memory-side interface 156 may include input/output (I/O) driver circuitry 158 that is configured to generate and receive signals carrying data, commands, or other information to be transmitted to and received from the controller 102. For example, data sensed into the data cache 144 may be sent to the I/O driver circuitry 158 for transmission to the controller 102. Similarly, data received from the controller 102 may be received by the I/O driver circuitry 158, and the I/O driver circuitry 158 may communicate the data to the data cache 144. Additionally, commands to be communicated between the controller 102 and the state machine 152 may be communicated via the I/O driver circuitry 158.

Additionally, the memory-side interface 156 may include input/output (I/O) contact pads 160 in communication with the I/O driver circuitry 158 that is configured to send signals to and receive signals from the I/O driver circuitry 158. For example, the signals that the I/O circuitry 158 generates for transmission to the controller 102 may be communicated from the I/O driver circuitry 158 to the I/O contact pads 160. Similarly, the signals that the memory-side interface 156 receives from the controller 102 may be sent from the I/O contact pads 160 to the I/O driver circuitry 158. In addition, as described in further detail below, the I/O contact pads 160 may be connected to packaging components, such as wire bonds, of a packaging of the memory dies 104, and may send signals to and receive signals from the packaging components in order for the signals to be communicated between the controller 130 and the memory-side interface 156.

Also, as shown in FIG. 2B, the memory-side interface 156 may include on-die termination (ODT) resistance 162, which may include one or more resistors or other circuit components providing a resistance. The on-die termination resistance 162 may provide termination impedance for signal paths that communicate signals between the controller 102 and the memory dies 104, and in particular, may be used for impedance matching between the memory dies 104 and the characteristic impedances of the signal paths. Resistors of the on-die termination resistance 162 may be connected to the I/O contact pads 160. In addition, the on-die termination resistance 162 may provide variable resistance levels or values. The resistance levels or values that the on-die termination resistances provide may be controlled by the controller 102, the state machine 152, or a combination thereof.

Figure 4:
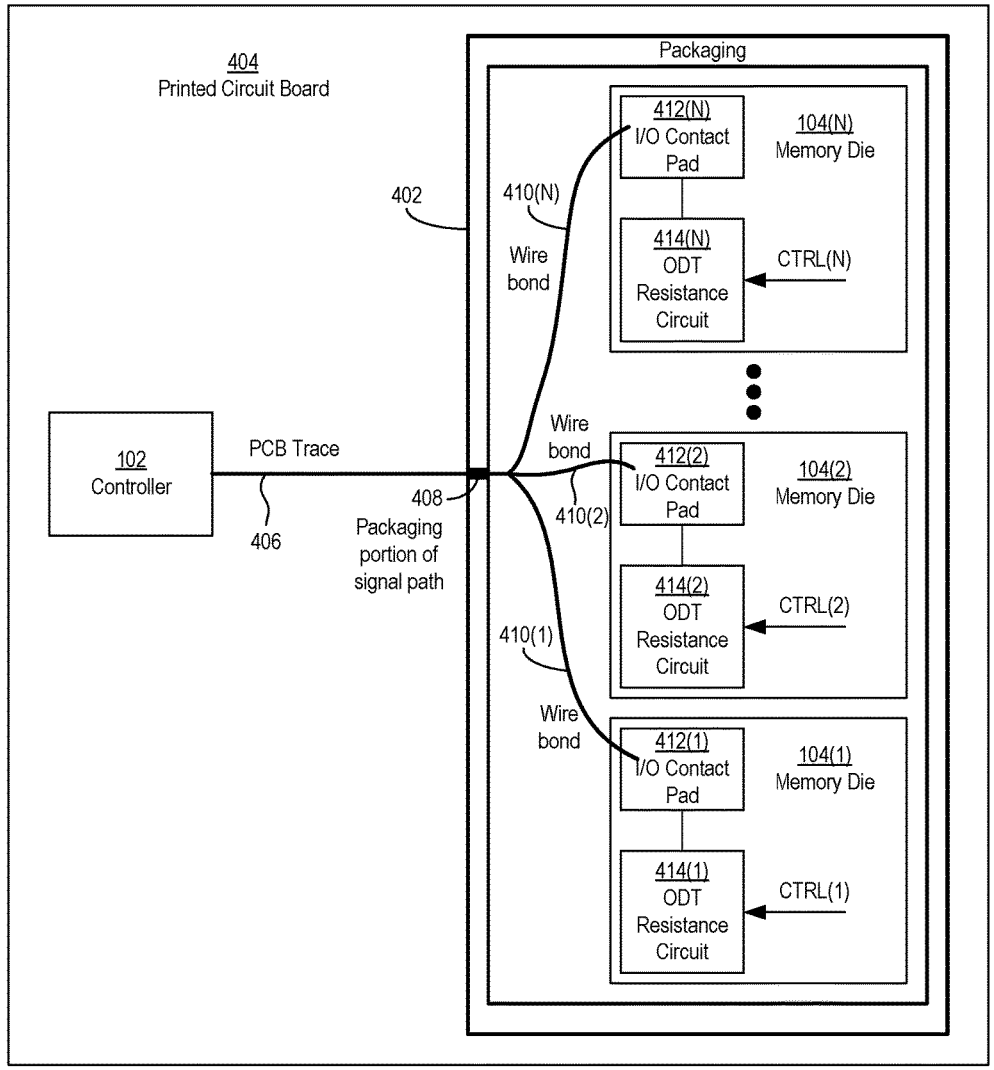
FIG. 4 is a block diagram of a structural layout of the controller and an N-number of a plurality of memory dies of FIGS. 1A-2B.

FIG. 4 shows a block diagram of a structural layout of the controller 102 and an N-number of the plurality of memory dies 104, including a first memory die 104(1), a second memory die 104(2), and an Nth memory die 104(N). N may be any integer of two or more. The N-number of memory dies 104(1)-104(N) may be all of the memory dies 104 in the memory system 100, or may be less than all of the memory dies 104. For example, the N-number of memory dies 104(1)-104(N) may be located on the same chip and/or may be part of the same chip enable group. The memory system 100 may include a single chip or chip enable group in which the memory dies 104 are located. Alternatively, the memory system 100 or may include multiple chips or chip enable groups, and some of the memory dies 104 may be located on one chip or in one chip enable group, while other memory dies 104 may be located on one or more other chips or in one or more other chip enable groups. Various configurations are possible.

As shown in FIG. 4, the memory dies 104(1)-104(N) may be configured in and/or integrated with a packaging 402, which may include various packaging components such as a die substrate, traces and vias integrated in the die substrate, solder balls, contact pads, wire bonds, and a cover, as non-limiting examples. The controller 102 may be configured and/or implemented as its own chip and/or integrated with its own packaging separate to that of the memory dies 104(1)-104(N). The controller 102 and the memory dies 104(1)-104(N) integrated with the packaging 402 may be integrated on a printed circuit board 404, as shown in FIG. 4.

The controller 102 and the memory dies 104(1)-104(N) may communicate signals between each other on signal paths connecting the controller 102 and the memory dies 104(1)-104(N). For simplicity, the physical layout of FIG. 4 shows a single signal path from the controller 102 to the memory dies 104(1)-104(N). However, in actual implementation, there may be multiple signal paths between the controller 102 and the memory dies 104(1)-104(N). Each signal path may be configured to carry one of more signals, with each signal being a data signal, a command signal, a clock signal, or any other type of signal that may be communicated between the controller 102 and the memory dies 104(1)-104(N). For the signal path shown in FIG. 4, one portion of the signal path may include a printed circuit board (PCB) trace 406 integrated with the printed circuit board 404 that extends between the controller 102 and the packaging 402. The PCB trace 406 may be implemented as a microstrip, stripline, vias, a combination thereof, or any other type of conductive trace configured to carry a signal over the printed circuit board 404 from the controller 102 to the packaging 402.

The PCB trace 406 may be connected to another portion of the signal path, which may be a conductive portion 408 of the packaging 402. As described in further detail below, the packaging portion 408 of the signal path may include solder balls, such as those of a ball grid array structure, vias and/or traces integrated in a die substrate, contact pads, and wire bonds. Shown separately from the packing portion 408 of the signal path are wire bonds 410(1)-410(N), each connected to the packing portion 408 of the signal path and a respective one of a plurality of I/O contact pads 412(1)-412(N) integrated with the memory dies 104(1)-104(N). For example, a first wire bond 410(1) is connected to a first I/O contact pad 412(1) of the first memory die 104(1), a second wire bond 410(2) is connected to a second I/O contact pad 412(2) of the second memory die 104(2), and a Nth wire bond 410(N) is connected to a Nth I/O contact pad 412(N). An I/O contact pads 412 shown in FIG. 4 may be representative of one of the I/O contact pads 160 shown in FIG. 2B.

Figure 5:
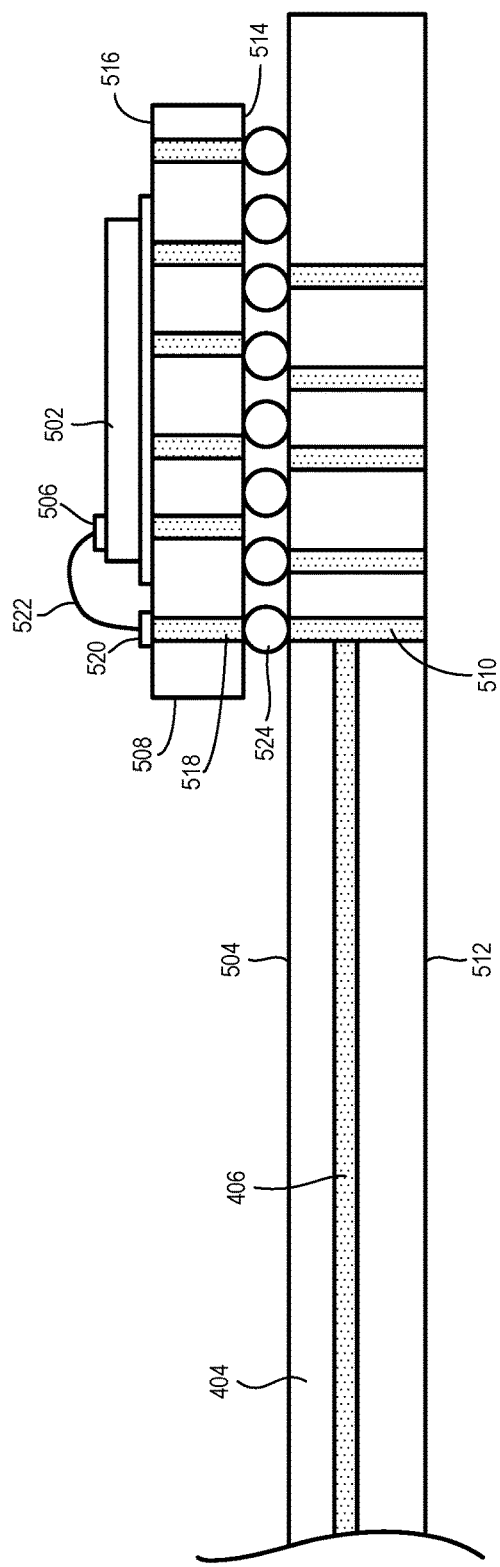
FIG. 5 is a cross-sectional side view of a die and at least a portion of its packaging integrated on a printed circuit board.

In addition, the N-number of memory dies 104(1)-104(N) may be part of the same chip group. The memory dies 104(1)-104(N) may be part of the same chip group by being located within the same packaging 402, having their respective I/O contact pads 412(1)-412(N) electrically connected to the same conductive portion 408 of the packaging 402, having their respective I/O contact pads 412(1)-412(N) electrically connected to the same PCB trace 406 between the controller 102 and the packaging 402, being identified by the controller 102 as being part of the same chip group, or some combination thereof. As described in further detail below, in order FIG. 5 shows a cross-sectional side view of a die 502 integrated with at least a portion of its packaging, and where the die 502 and packaging are disposed on a first planar surface 504 of the printed circuit board 404. The die 502 may be representative of one of the memory dies 104(1)-104(N) of FIG. 4. In addition, an I/O contact pad 506 may be implemented on the die 506. The I/O contact pad 506 may be representative of one of the 412(1)-412(N) of FIG. 4. FIG. 5 also shows at least a portion of the PCB trace 406 extending in the printed circuit board 404. In addition, for the configuration shown in FIG. 5, the die 502 may be implemented on a die substrate 508.

The printed circuit board 404 may include a plurality of vias 510 extending between the first planar surface 504 and a second, opposing planar surface 512. At least one of the vias 510 may be connected to and form part of the signal path with the PCB trace 406 to communicate signals between the PCB trace 406 and the first planar surface 504. Configurations other than the one shown in FIG. 5 may be possible. For example, more than one of the vias 510, which may be connected to other traces in or on the printed circuit 404 (not shown), may be used to communicate signals between the PCB trace 406 and the first planar surface 504. In addition, the die substrate 508 may include vias 518 extending between first and second planar surfaces 514, 516 to communicate signals between the first planar surface 514 and the second, opposing planar surface 516 on which the die 502 may be implemented. At least one of the vias 518 may be electrically coupled to and form part of the signal path with the PCB trace 406. Other example configurations may use traces in and/or on the die substrate 508 that are connected to the vias 518 to communicate signals between the first and second planar surfaces 514, 516. In addition, as shown in FIG. 5, a contact pad 520 may be disposed on the second planar surface 516 of the die substrate 508 and electrically connected to one of the vias 518 to form part of the signal path with the PCB trace 406. A wire bond 522 may be in contact with each of the contact pad 520 and the I/O contact pad 506 of the die 502 to electrically connect the contact pad 520 and the I/O contact pad 506 of the die 502.

Also, for the configuration shown in FIG. 5, a plurality of solder balls 524 configured as a ball grid array may be disposed in between the first planar surface 504 of the printed circuit board 404 and the first planar surface 514 of the die substrate 508 and electrically coupled the conductive members integrated in the printed circuit board 404 (e.g., the vias 510) with the conductive members integrated in the die substrate 508 (e.g., the vias 518). As shown in FIG. 5, one of the solder balls 524 may be electrically coupled to and form part of the signal path with the PCB trace 406.

Accordingly, a signal transmitted from the controller 102 to be received by the I/O contact pad 506 may be transmitted along the PCB trace 406, through the via 510 of the printed circuit board 404, the solder ball 524 of the ball grid array, the via 518 of the die substrate 508, the contact pad 520, the wire bond 522, and to the I/O contact pad 506. Similarly, a signal transmitted from the die 502 to the controller 102 via the PCB trace 406 may be transmitted from the I/O contact pad 506, through the wire bond 522, the contact pad 520, the via 518 of the die substrate 508, the solder ball 524, the via 510 of the printed circuit 404, and to the PCB trace 406, where the signal is sent to the controller 102.

The configuration shown in FIG. 5 is merely exemplary, and other configurations utilizing packaging components to communicate signals between a PCB trace and an I/O contact pad of a die may be possible.

Figure 6:
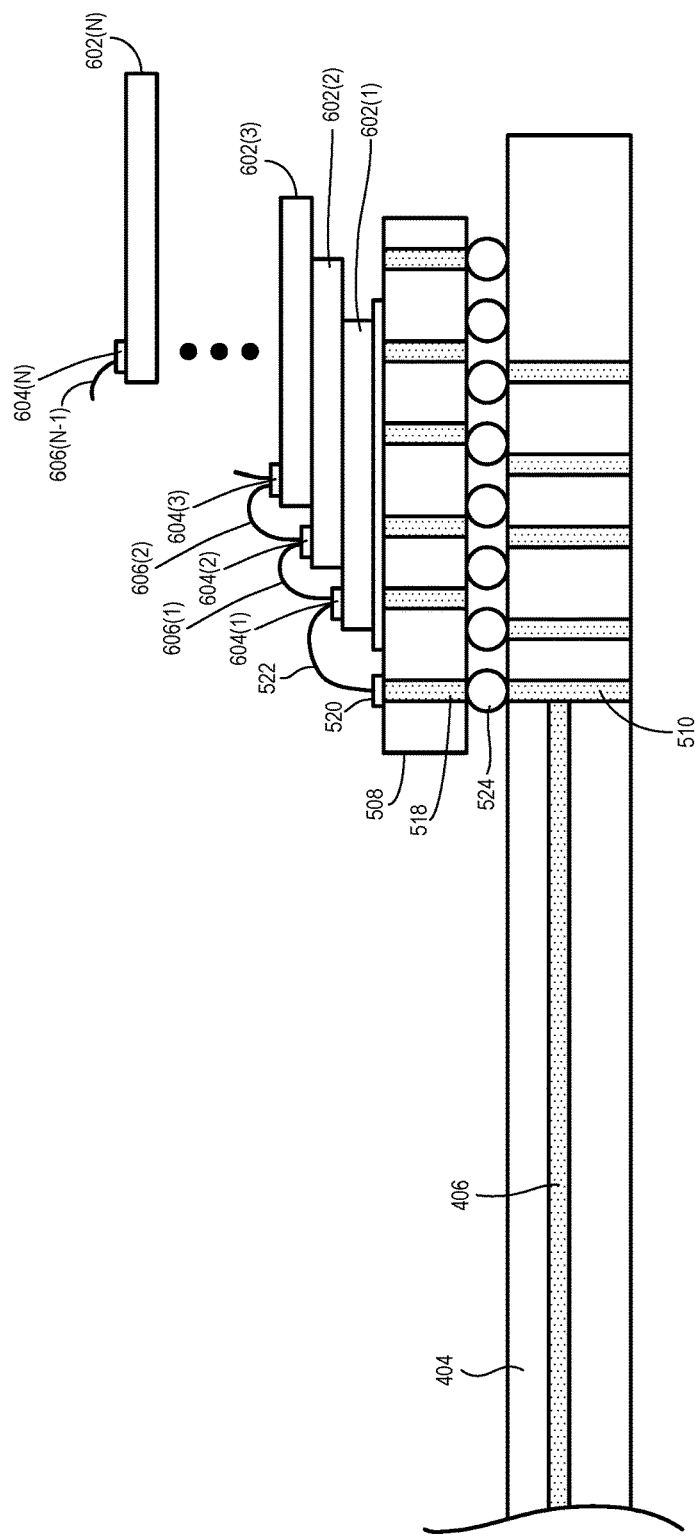
FIG. 6 is cross-sectional side view of a plurality of memory dies integrated as a stack.

FIG. 6 shows a cross-sectional side view of a plurality of memory dies 602(1)-602(N) integrated as a stack, and in particular a staircase stack. The plurality of memory dies 602(1)-602(N) may be representative of the plurality of memory dies 104(1)-104(N), and illustrate an example configuration in which the plurality of memory dies 104(1)-104(N) may be integrated with each other and the packaging 402. In addition, a first memory die 602(1) may be representative of the die 502 of FIG. 5 and have a first I/O contact pad 604(1) representative of the I/O contact pad 506. Accordingly, the first memory die 602(1) and the first I/O contact pad 604(1) may be integrated with the printed circuit board 404, the PCB trace 406, the vias 510 of the printed circuit board 404, the die substrate 508, the vias 518 of the die substrate 510, the contact pad 520, and the wire bond 522, as previously explained with reference to FIG. 5.

In addition, the other memory dies 602(2)-602(N) are stacked on the first memory die 602(1) in a staircase configuration such that the second memory die 602(2) is disposed on the first memory die 602(1), the third memory die 602(3) is disposed on the second memory die 602(2), and the Nth memory die 602(N) is disposed on the (N−1)th memory die 602(N−1) (not shown). Also, as shown in FIG. 6, each of the other memory dies 602(2)-602(N) may have respective I/O contact pads 604(2)-604(N). For the stacked configuration shown in FIG. 6, each of the I/O contact pads 604(2)-604(N) may be electrically coupled with each other, such as with wire bonds. For example, a first wire bond 606(1) is in contact with and electrically connects the first I/O contact pad 604(1) and the second I/O contact pad 604(2), a second wire 606(2) is in contact with and electrically connects the second I/O contact pad 604(2) and the third contact pad 604(3), and a (N−1)th wire bond 606(N−1) is in contact with and electrically connects a (N−1)th I/O contact pad (not shown) and the Nth I/O contact pad 604(N). Accordingly, each of the I/O contact pads 604(1)-604(N) of the memory dies 602(1)-602(N) are electrically coupled to the conductive packaging components that form part of the signal path with the PCB trace 406, such as the contact 520, the via 518 of the die substrate 508, and the solder ball 524.

The wire bond connection shown in FIG. 6 is similar to the configuration shown in FIG. 4, in which the wire bonds 410(1)-410(N) electrically connect each of the I/O contact pads 412(1)-412(N) of the memory dies 104(1)-104(N) with the packaging portion 408 and the PCB trace 406 of the signal path. In that regard, each of the wire bonds 410(1)-410(N) and the I/O contact pads 412(1)-412(N) of FIG. 4, and the wire bonds 606(1)-606(N−1) and the I/O contact pads 604(1)-604(N) are electrically coupled to and form part of the signal path with the PCB trace 406.

Referring particularly to FIG. 4, the controller 102 may want to send a signal on the signal path including PCB trace 406 to a particular one of the memory dies 104(1)-104(N), not to all of them. For example, the controller 102 may want to send a command to and/or data to be programmed into a particular one of the memory dies 104(1)-104(N). To do so, the controller 102 may send information to the memory dies 104(1)-104(N) that indicates to the plurality of memory dies 104(1)-104(N) the particular memory die with which the controller 102 wants to communicate. Upon receipt of the information, the particular memory die may be configured to accept (e.g., by latching onto) the signal for further processing, while the other memory dies may be configured to disregard the signal. This way, even though all of the memory dies 104(1)-104(N) are configured to receive the signal, only the memory die that is the intended recipient accepts and processes the signal.

As shown in FIG. 4, each of the memory dies 104(1)-104(N) includes a respective on-die termination (ODT) resistance circuit 414 connected to an associated I/O contact pad 412. For example, the first memory die 104(1) includes a first on-die termination resistance circuit 414(1) connected to the first I/O contact pad 412(1), the second memory die 104(2) includes a second on-die termination resistance circuit 414(2) connected to the second I/O contact pad 412(2), and the Nth memory die 104(N) includes an Nth on-die termination resistance circuit 414(N) connected to the Nth I/O contact pad 412(N). Each of the on-die termination resistance circuits 414(1)-414(N) may provide variable resistance levels or values. The resistance level that each of the on-die termination resistance circuits 414(1)-414(N) provides may be determined and/or controlled by the controller 102, the plurality of memory dies 104(1)-104(N), such as by their respective state machines 152 (FIG. 2B), or a combination thereof. As shown in FIG. 4, each of the on-die termination resistance circuits 414(1)-414(N) may be configured to receive a respective control signal CTRL(1)-CTRL(N) that sets and/or adjusts the resistance level. For some example configurations, the controller 102 may send a command signal to a particular memory die 104 to set its on-die termination resistance circuit 414 to a certain resistance level. In response, the state machine 152 (FIG. 2B) of the particular memory die 104 may set and/or adjust the resistance level resistance circuit 414 according to the command signal, such as by outputting a respective control signal CTRL.

The resistance levels that each of the on-die termination resistance circuits 414(1)-414(N) may be set to may include at least two levels, including a high resistance level and a low resistance level. In a particular example configuration, the high resistance level may be a high impedance level, which may be in the kilohms (kΩ) range, such as 10 kΩ for example, or higher. The low resistance level may be on the order of tens or hundreds of Ohms, and in particular, may correspond to a typical or common characteristic impedance value, such as in a range of 40Ω-60Ω, or particularly 50Ω, as examples.

For other example configurations, one or more of the on-die termination resistance circuits 414(1)-414(N) may be set to more than two levels, including one or more intermediate resistance levels between the high resistance level and the low resistance level. In other words, an on-die termination resistance circuit 414 may be set to a resistance value included in a range of resistance levels, with the high resistance level being an upper bound of the range and the low resistance value being a lower bound of the range, and with one or more intermediate resistance levels included between the high resistance level and the low resistance level. In some of example configurations, the intermediate levels may be closer to the low resistance level than to the high resistance level. For example, while the high resistance level may be in the kilohm or tens of kilohm range (or higher), the intermediate resistance levels may be in the hundreds of Ohms range. For some of these configurations, the low resistance level and the intermediate levels may form a group of low resistance levels, where the low resistance level is an absolute low level of the group. When a particular memory die 104 is to set its on-die termination resistance circuit 414 to a low level, the on-die state machine 152 may be configured to identify which of the low resistance values in the group to which to set the on-die termination resistance circuit 414.

For simplicity, as used hereafter and unless expressly described otherwise, an on-die termination resistance circuit 414 being set and/or adjusted to a low level may mean that the on-die termination resistance circuit 414 is set and/or adjusted to a resistance level that is lower than the high (or highest) resistance value to which the on-die termination resistance circuit 414 may be set, which may not necessarily be an absolute low level. In this regard, where two on-die termination circuits 414 are set and/or adjusted to a low resistance level, their respective low resistance levels may be the same as or different from each other. As a non-limiting example, suppose two on-die termination resistance circuits 414 of two memory dies 104 are each configured to be set to a high value of 10 kΩ and to low levels of 50Ω and 100Ω. Accordingly, at a given point in time, when the two on-die termination resistance circuits 414 of the two memory dies 104 are at, set to, and/or adjusted to low resistance levels, the two on-die termination circuits 414 may both be at 50Ω, both be at 100Ω, or one may be at 50Ω while the other is at 100Ω.

With the wire bonds 410(1)-410(N) and the I/O contact pads 412(1)-412(N) being connected together, the on-die termination resistance circuits 414(1)-414(N) may be connected in parallel with each other. The parallel connection of the on-die termination resistance circuits 414(1)-414(N) may provide an overall termination resistance level for the signal path. At any given point in time, the on-die termination resistance circuits 414(1)-414(N) providing their respective resistances at the lower resistance levels will have a greater impact on the overall termination resistance level compared to the on-die termination resistance circuits 414(1)-414(N) providing their respective resistances at the higher resistance level, due to the parallel connection.

For some example configurations, when the controller 102 wants to communicate with a particular memory die (referred to as a target memory die), such as by sending a command or data to that memory die, the controller 102 may first send instructions to the memory dies 104(1)-104(N) that instructs the memory dies 104 to set the on-die termination resistance of the target memory die to the low resistance level. In response, the memory dies 104(1)-104(N) may operate to set the on-die termination resistance of the target memory die to the low resistance level, while keeping the other memory dies at the high resistance level. For particular example configurations where the high resistance level is substantially higher than the low resistance level (e.g., 10 kΩ compared to 50Ω, as described above), the overall termination resistance level of the plurality of memory dies 104(1)-104(N) may be about equal to the low resistance level of the on-die termination resistance of the target memory die. The overall termination resistance, when equal or about equal to the low resistance level of the on-die termination resistance of the target memory die, may be closer to the characteristic impedance of other portions of the signal path, such as the characteristic impedance of the PCB trace 406 and the characteristic impedance of the packaging portion 408.

However, for some example configurations, the characteristic impedance of the packaging portion 408 may be different than the overall termination resistance when only the target memory die is set to the low resistance level. For example, the characteristic impedance of the packaging portion 408 may be lower than the low or lowest overall termination resistance level that can be achieved when only the on-die termination resistance circuit 414 of the target memory die is set to its lowest resistance level. In a particular example, the characteristic impedance of the packaging portion 408 may be about 10Ω, while the overall on-die termination resistance may be about 50Ω when only the target memory die is set to the low level. This impedance mismatch between the characteristic impedance of the packaging portion 408 and the overall on-die termination resistance when only the target memory die is set to the low resistance level may cause energy reflection and ultimately a degradation in signal integrity and performance.

Referring to both FIGS. 4 and 5, the structural or physical dimensions of the packaging portion 408, (e.g., the via 518, the contact pad 520, and/or the wire bond 522 shown in FIG. 5), the I/O contact pads 412, and the wire bonds 410 may, in large part, determine the characteristic impedance of the packaging portion 408. Modifying the structural dimensions (e.g., the size of the via 518, the size of the contact pads 412, 520, and/or the size of the wire bonds 410, 522) may be undesirable or not possible. For example, decreasing the size of the contact pads 412 or 520 may increase the characteristic impedance of the packaging portion 408, but the decrease in size may undesirably provide too small of a contact area for the wire bonds 410, 522 to bond to. As another example, lengthening the wire bonds 410, 522 may increase the characteristic impedance, but the increased length may not be compatible with the remainder of the packaging. Without the ability to alter the characteristic impedance of the packaging portion 408 by changing the physical dimensions, other ways to move the characteristic impedance and the overall on-die resistance of the memory dies 104(1)-104(N) closer to each other in order to minimize impedance mismatch may be desirable.

In the present description, instead of setting only the on-die termination resistance of the target memory die to the low resistance level, the plurality of memory dies 104(1)-104(N) may set at least two of the on-die termination resistance circuits 414(1)-414(N) of the memory dies 104(1)-104(N) to the low resistance level in order to set or tune an overall on-die termination resistance of the memory dies 104(1)-(N) to be closer to the characteristic impedance of the packaging portion 408. How many of the on-die termination resistance circuits 104 are set to the low resistance level may depend on the characteristic impedance of the packaging portion 408 of the signal path, the low resistance levels to which the on-die termination resistance circuits 414(1)-414(N) are set, power consumption considerations, and a maximum acceptable impedance mismatch between the characteristic impedance of the packaging portion 408 and the overall on-die termination resistance of the memory dies 104(1)-104(N).

To illustrate, suppose the characteristic impedance of the packaging portion 408 is about 10Ω, and the low resistance levels to which the on-die termination resistance circuits 414(1)-414(N) may be set are each 50Ω. Setting five of the on-die termination resistance circuits 414(1)-414(N) to the low resistance level of 50Ω while keeping the other on-die termination resistance circuits 414(1)-414(N) may provide an overall on-die termination resistance of 10Ω—i.e., an overall on-die termination resistance that is closest to the characteristic impedance of the packaging portion 408. However, increasing the number of on-die termination resistance circuits 414(1)-414(N) that are set to the low resistance level may increase power consumption, due to turning on switching circuitry of the on-die termination resistance circuits 414(1)-414(N). Such an increase in power consumption, which may be undesirable, especially for a relatively large amount of increase. Accordingly, there may be a tradeoff between achieving a closest impedance match between the characteristic impedance of the packaging portion 408 and the overall on-die termination resistance of the memory dies 104(1)-104(N). For the present example, setting a number of on-die termination resistance circuits that is less than five but greater than one may provide a satisfactory balance between reducing impedance mismatch and increasing power consumption. For example, setting three of the on-die termination resistance circuits 414(1)-414(N) to the lower resistance level may yield an overall on-die termination resistance of about 16.67Ω, which may provide an acceptable mismatch between the characteristic impedance of the packaging portion 408 and the overall on-die termination resistance, as well as an acceptable increase in power consumption by setting two additional on-die termination circuits 414(1)-414(N) to the lower resistance level.

For some example configurations, one of the multiple on-die termination resistance circuits set to the lower resistance level may be the on-die termination resistance circuit of the target die. For other example configurations, the target die is not one of the memory dies having its on-die termination resistance set to the lower resistance level. For configurations where the target memory die has its on-die termination resistance set to the lower level, one or more other memory dies that are set to the lower resistance level may be adjacent to or neighboring the target die, non-adjacent or non-neighboring to the target memory die, or some combination thereof.

To illustrate, suppose the number of memory dies 104(1)-104(N) is 16 (i.e., N=16). In addition, suppose for a given communication between the controller 102 and the plurality of memory dies 104(1)-104(N), the target memory die is the second memory die 104(2), and the plurality of memory dies 104 are configured to set 3 of the 16 on-die termination resistance circuits to the low resistance level, while setting or keeping the other 13 on-die termination resistance circuits at the high resistance level. In some example configurations, the plurality of memory dies 104(1)-104(N) may set the second on-die termination resistance circuit 414(2) of the target memory die (i.e., the second memory die 104(2), as well as the adjacent first and third on-die termination resistance circuits 414(1), 414(3), to the low resistance level. Alternatively, for other example configurations, one or more non-adjacent on-die termination resistance circuits, such as the fifteenth and sixteenth on-die termination resistance circuits for example, may be set to the lower levels. For still other example configurations, the on-die termination resistance circuits that are set to the lower level may not include the second on-die termination resistance circuit of the target (second) memory die 104(2). In general, for the example illustration, the plurality of memory dies 104(1)-104(N) may be configured to set three of the 16 on-die termination resistance circuits to the lower resistance level while setting the other 13 on-die termination resistance circuits to the high resistance level, and which of the three are set to the lower level may vary.

In operation, at a given point in time, the controller 102 may determine to communicate with a target memory die, such as by transmitting a signal to the target memory die. For example, for a write operation to be performed and/or during a write cycle, the controller 102 may determine it wants to transmit a data signal carrying data to the target memory die to have the target memory die program or write the data into its memory cells. In addition or alternatively, the controller 102 may determine it wants to transmit other signals associated with the write operation to the target die, such as a clock signal, control signals associated with the write operation, and/or address signals, as non-limiting examples. As another example, for a read operation and/or during a read cycle, the controller 102 may determine it wants to transmit a read-enable signal, one or more control signals associated with the read operation, and/or address signals, as non-limiting examples. Other signals that the controller 102 may determine it wants to send to a target memory die may be possible.

The controller 102 and the memory dies 104 may be configured to communicate commands according to various pre-signaling schemes in order for the target memory die to receive and accept (e.g., latch onto) the signal for further processing. For example, prior to sending the signal, if the target memory die is part of a chip group that is disabled, the controller 102 may send a chip enable command to the chip group to enable it. In addition, the controller 102 may send a target die identification command to the memory dies 104(1)-104(N) indicating that the controller 102 wants to communicate with the target memory die. The target die identification command may include information that identifies which of the memory dies 104(1)-104(N) is the target die. In response to the command, the target memory die may be configured to be ready to accept (such as by latching onto) signals transmitted by the controller 102. In addition, the controller 102 may send one or more on-die termination enable commands to the memory dies 104(1)-104(N). In response to the on-die termination enable commands, the memory dies 104(1)-104(N) may set at least two of the on-die termination resistance circuits 414(1)-414(N) of at least two of the memory dies 104(1)-104(N) to the low resistance level, and may set or keep remaining on-die termination resistance circuits 414(1)-414(N) at the high resistance level. In a particular example configuration, the controller 102 may send a separate on-die termination enable command for each on-die termination resistance circuit 414 to be set to a low level.

In some example configurations, the controller 102 may be configured to determine whether and/or which commands of the pre-signaling scheme to send prior to sending the signal. For example, if prior to sending the signal, the on-die termination resistance circuits 414 are already set to high and low resistance levels as desired, the controller 102 may not send on-die termination enable commands prior to sending the signal. Also, for some example configurations, one command may achieve multiple objectives such that multiple commands do not need to be sent from the controller 102 to the memory dies 104. For example, sending a target die identification command may cause both the target memory die 104 to be ready to receive and accept the signal, as well as cause the memory dies 104 to set their on-die termination resistance circuits 414 to certain high and low levels as desired, such that separate on-die termination enable commands are not sent. Various pre-signaling schemes may be possible. In general, prior to the controller 102 sending a signal to a target die for further processing, memory dies 104(1)-104(N) may be configured such that the target die may be ready to receive and accept the signal for further processing, and at least two memory dies 104(1)-104(N) may have their on-die termination resistance circuits 414 set to a low resistance level, at least one of the on-die termination resistance circuits being a non-target memory die.

In response to the memory dies 104(1)-104(N) being configured as desired, the controller 102 may transmit the signal along the signal path to the plurality of memory dies 104(1)-104(N). In response, the target memory die may accept the received signal and process it. For example, if the signal is a data signal, the target memory die may program the data into its memory elements. Alternatively, if the signal is a command signal, the target memory die may perform the command indicated in the command signal. By setting at least two of the on-die termination resistance circuits 414(1)-414(N) to the low resistance level, the characteristic impedance of the packaging portion 408 and the overall on-die termination resistance may be more closely matched during the communication of the signal compared to configurations where only the on-die termination resistance circuit of the target die is set to the lower resistance level. Doing so may result in reduced signal degradation and/or improved signal integrity for communication of the signal between the packaging portion 408 and the I/O contact pad 412 of the target memory die.

Figure 7:
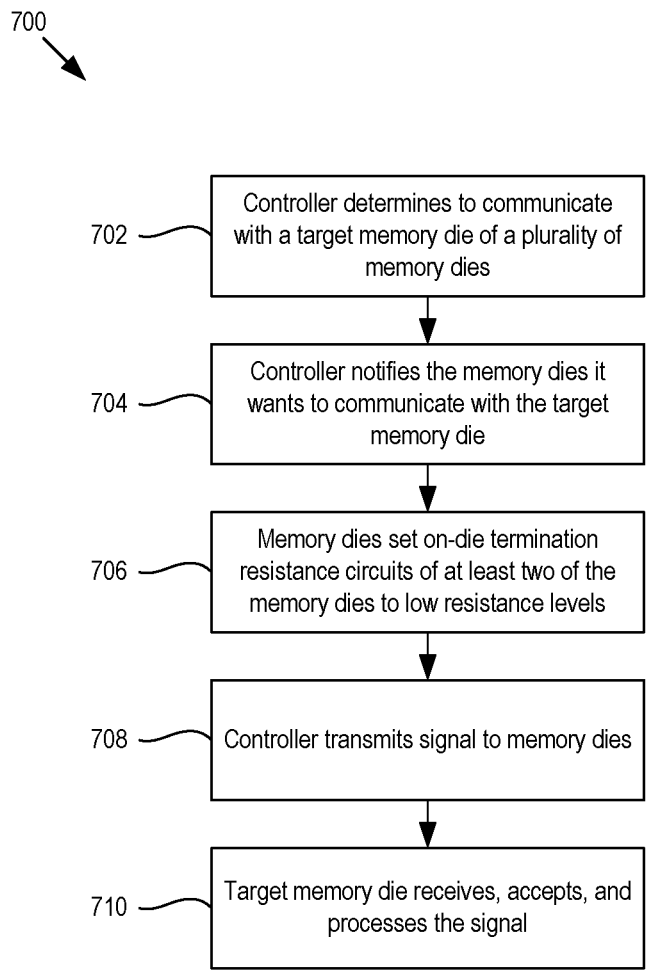
FIG. 7 is a flow chart of an example method of setting an overall on-die termination of a plurality of memory dies.

FIG. 7 is a flow chart of an example method 700 of setting an overall on-die termination resistance of a plurality of memory dies of a memory system, such as the plurality of memory dies 104(1)-104(N) shown in FIG. 4. At block 702, a controller of the memory system (e.g., the controller 102 of FIGS. 1A, 1B, 2A, 2B, 4) may determine to communicate with a target memory die of the plurality of memory dies, such as by transmitting a signal (e.g., data, command, clock, enable, address, etc.) to the target memory die.

At block 704, in response to the determination at block 702, the controller may send one or more commands or instructions to or otherwise notify the memory dies indicating that the controller wants to communicate with the target memory die. At block 706, in response to the command or instructions, the memory dies may set on-die termination resistance circuits to certain resistance levels, provided that the on-die termination resistance circuits are not already set to the certain resistance levels. In particular, the memory dies may set the on-die termination resistance circuits of at least two of the memory dies to a low resistance level and may set or keep remaining on-die termination resistance circuits at a high resistance level. For some example methods, one of the on-die termination resistance circuits set to the low resistance level may be the on-die termination resistance circuit of the target memory die. For other example methods, the on-die termination resistance circuits set to the lower resistance level may not include the on-die termination resistance circuit of the target memory die. A result of the resistance level setting is that a first set of the memory dies may have their on-die termination resistance set to and/or be at the low resistance level, and a second set of the memory dies may have their on-die termination resistance set to and/or be at the high resistance level. Additionally, at block 706, the target memory die may be configured to be ready to accept (such as by latching onto) a signal to be transmitted by the controller as part of the communication between the controller and the target memory die.

At block 708, upon the on-die termination resistance circuits being at and/or set to high and low resistance levels as desired, the controller may transmit the signal along a signal path to the plurality of memory dies. The signal path may include a conductive trace integrated with a printed circuit board on which the controller and the memory dies are implemented. The signal path may also include conductive components of a packaging of the memory dies, such as vias, contact pads, and wire bonds, as previously described. At block 710, in response to the transmission, the target memory die may accept the received signal and process it. For example, if the signal is a data signal, the target memory die may program the data into its memory elements. As another example, if the signal is a command signal, the target memory die may perform the command indicated in the command signal.

The example method 700 may be repeated for various times that the controller wants to communicate with a target die. For some example configurations, which of the on-die termination resistance circuits that are set to the low resistance level may always be the same among different communications regardless of which memory die is the target die for a particular communication. In other example configurations, the on-die termination resistance circuits that are set to the low resistance level may change among different communications, but which on-die termination resistance circuits are set to the low resistance level may not depend on which memory dies is the target die. In still other example configurations, which on-die termination resistance circuits are set to the low resistance level may change among different communications, and which on-die termination resistance circuits are set to the low resistance level may depend on the which memory die is the target memory die.

In addition, although the setting of two- or more on-die termination resistances is described with reference to a memory system that includes a plurality of memory dies, similar processes may performed in non-memory applications, such as in multi-die electronic systems where one or more of the dies do not include memory elements and/or are configured to store data, and where the on-die termination resistance circuits of the dies are connected in parallel with each other.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. An apparatus comprising:
a plurality of dies;
a controller configured to:
   identify a target die of the plurality of dies with which to communicate; and
   in response to the identification, communicate a signal to the target die via a signal path connecting the controller and the target die,
   wherein during the communication, a termination resistance circuit of a non-target die is at a low resistance level.

2. The apparatus of claim 1, wherein the non-target die is configured to adjust the termination resistance circuit of the non-target die from a high resistance level to the low resistance level prior to the communication of the signal to the target die.

3. The apparatus of claim 2, wherein the low resistance level is in a range of about 40-60 Ohms.

4. The apparatus of claim 2, wherein the low resistance level is a minimum level to which the termination resistance circuit is configured to be set.

5. The apparatus of claim 2, wherein the high resistance level is greater than one kilohm (1 kΩ).

6. The apparatus of claim 1, wherein the controller, in response to the identification, is further configured to set a termination resistance circuit of the target die to the low resistance level, wherein the termination resistance circuit of the target die and the termination resistance circuit of the non-target die form a parallel connection.

7. The apparatus of claim 6, wherein the controller, in response to the identification is further configured to set a plurality of termination resistance circuits of a plurality of non-target dies to the low resistance level, wherein the plurality of termination resistance circuits of the plurality of non-target dies and the target resistance of the target die form a parallel connection with each other.

8. The apparatus of claim 7, wherein a number of the plurality of non-target dies is less than a total number of the plurality of dies.

9. The apparatus of claim 1, wherein the plurality of dies are part of a same chip group.

10. The apparatus of claim 1, wherein the plurality of dies are configured as a stack.

11. A method comprising:
  identifying, with a controller, a target die of a plurality of dies with which to communicate; and
  in response to the identifying, transmitting, with the controller, a signal to the target die via a signal path connecting the controller and the target die, wherein a termination resistance circuit of a non-target die of the plurality of dies is set to a low resistance level during the transmitting of the signal.

12. The method of claim 11, wherein the low resistance level is in a range of about 40-60 Ohms.

13. The method of claim 11, wherein the low resistance level is a minimum level to which the termination resistance circuit is configured to be set.

14. The method of claim 11, further comprising:
  adjusting, with the non-target die, the termination resistance circuit from a high resistance level to the low resistance level prior to the transmitting of the signal to the target die.

15. The method of claim 14, wherein the high resistance level is greater than one kilohm (1 k$\Omega$).

16. The method of claim 11, further comprising:
  in response to the identifying, setting, with the controller, a termination resistance circuit of the target die to the low resistance level.

17. The method of claim 16 further comprising:
  in response to the identifying, setting, with the controller, a plurality of termination resistance circuits of a plurality of non-target dies to the low resistance level.

18. The method of claim 17, wherein a number of the plurality of non-target dies is less than a total number of the plurality of dies.

19. The method of claim 11, wherein the plurality of dies are part of a same chip group.

20. The method of claim 11, wherein the plurality of dies are configured as a stack.

21. An apparatus comprising:
  a plurality of dies;
  means for identifying a target die of the plurality of dies with which to communicate a signal; and
  means for communicating the signal to the target die via a signal path, wherein a termination resistance of a non-target die of the plurality of dies is at a low resistance level while the signal is communicated on the signal path.

\* \* \* \* \*